United States Patent
Liang et al.

(10) Patent No.: US 10,347,529 B2
(45) Date of Patent: Jul. 9, 2019

(54) INTERCONNECT STRUCTURES

(71) Applicant: GLOBALFOUNDRIES INC., Grand Cayman (KY)

(72) Inventors: Jim Shih-Chun Liang, Poughkeepsie, NY (US); Keith Kwong Hon Wong, Wappingers Fall, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/724,431

(22) Filed: Oct. 4, 2017

(65) Prior Publication Data

US 2019/0103310 A1    Apr. 4, 2019

(51) Int. Cl.
*H01L 21/76* (2006.01)
*H01L 21/768* (2006.01)
*H01L 23/498* (2006.01)
*H01L 23/522* (2006.01)
*H01L 23/532* (2006.01)

(52) U.S. Cl.
CPC .. *H01L 21/76877* (2013.01); *H01L 21/76802* (2013.01); *H01L 21/76873* (2013.01); *H01L 23/49866* (2013.01); *H01L 23/5226* (2013.01); *H01L 23/53228* (2013.01); *H01L 23/53257* (2013.01); *H01L 23/53238* (2013.01); *H01L 2924/01029* (2013.01)

(58) Field of Classification Search
CPC ............... H01L 21/76; H01L 21/76877; H01L 21/76802; H01L 21/76873
See application file for complete search history.

(56) References Cited

U.S. PATENT DOCUMENTS

| | | | |
|---|---|---|---|
| 6,114,243 A * | 9/2000 | Gupta | H01L 21/7684 257/E21.583 |
| 6,759,343 B2 | 7/2004 | Lee et al. | |
| 7,157,795 B1 * | 1/2007 | Erb | H01L 21/2855 257/751 |
| 9,059,176 B2 | 6/2015 | Baumann et al. | |
| 2003/0003711 A1 | 1/2003 | Modak | |
| 2011/0012238 A1 * | 1/2011 | Cohen | H01L 21/76825 257/637 |
| 2013/0299988 A1 * | 11/2013 | Bonilla | H01L 21/76877 257/751 |
| 2014/0183738 A1 | 7/2014 | Jezewski et al. | |

(Continued)

OTHER PUBLICATIONS

Veen et al., Cobalt Bottom-Up Contact and Via Prefill enabling Advanced Logic and DRAM Technologies, IEEE, 2015, 4 pages.

(Continued)

*Primary Examiner* — Phuc T Dang
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to interconnect structures and methods of manufacture. The structure includes a metallization feature comprising a fill material and formed within a dielectric layer; at least one cap covering the fill material of the metallization feature, the at least one cap is comprised of a material different than the fill material of the metallization feature; and an interconnect structure in electrical contact with the metallization feature.

20 Claims, 5 Drawing Sheets

(56) References Cited

U.S. PATENT DOCUMENTS

| | | | |
|---|---|---|---|
| 2014/0264872 A1* | 9/2014 | Lin | H01L 23/53233 |
| | | | 257/751 |
| 2015/0028483 A1 | 1/2015 | Zhou | |
| 2015/0380296 A1* | 12/2015 | Antonelli | H01L 21/76883 |
| | | | 438/643 |
| 2016/0056076 A1* | 2/2016 | Edelstein | H01L 21/76879 |
| | | | 438/627 |
| 2016/0309596 A1 | 10/2016 | Shaviv et al. | |
| 2017/0047282 A1* | 2/2017 | Sun | H01L 23/528 |
| 2017/0140981 A1* | 5/2017 | Edelstein | H01L 21/76858 |
| 2017/0162431 A1* | 6/2017 | Ahn | H01L 21/7682 |
| 2018/0096888 A1* | 4/2018 | Naik | H01L 21/76849 |
| 2018/0261759 A1* | 9/2018 | Bhosale | H01L 43/02 |

OTHER PUBLICATIONS

Schluter et al., "Managing Corrosion during the Chemical Mechanical Polishing (CMP) of Metal Films", The Electrochemical Society, 2012, 1 page.

Nogami et al.,"Through-Cobalt Self Forming Barrier (tCoSFB) for Cu/ULK BEOL: A Novel Concept for Advance Technology Nodes", IEEE, 2015, 4 pages.

Park et al., "Self-forming Al oxide barrier for nanoscale Cu interconnects created by hybrid atomic layer deposition of Cu—Al alloy", Journal of Vacuum Science & Technology A: Vacuum, Surfaces, and Films, Jan./Feb. 2014, 7 pages.

* cited by examiner

INTERCONNECT STRUCTURES

FIELD OF THE INVENTION

The present disclosure generally relates to semiconductor structures and, more particularly, to interconnect structures and methods of manufacture.

BACKGROUND

During the fabrication process, various steps can cause defects in the metallization features of a device. For example, during a chemical mechanical polishing (CMP) process, corrosion of a metal fill may occur. Specifically, the metal fill can thermodynamically oxidize and will not self-passivate, so that oxidation continues, thereby causing corrosion. Examples of types of corrosion which may occur include pitting and dishing, amongst other examples.

During an annealing and/or etching process, out-diffusion of the metal fill may also occur, resulting in protrusions of the metal fill. During a deposition process, such as the deposition of a layer over the metal fill, surface migration of the metal fill may occur, resulting in the metal fill diffusing into the surrounding dielectric material and in time-dependent dielectric breakdown (TDDB). Additionally, electromigration of the metal fill may occur, resulting in voiding of the interconnect lines.

SUMMARY

In an aspect of the disclosure, a structure comprises: a metallization feature comprising a fill material and formed within a dielectric layer; at least one cap covering the fill material of the metallization feature, the at least one cap is comprised of a material different than the fill material of the metallization feature; and an interconnect structure in electrical contact with the metallization feature.

In an aspect of the disclosure, a structure comprises: a metallization feature formed within a lined trench of a dielectric layer and comprising a fill material; a first cap covering the fill material; a film directly over the first cap and the fill material of the metallization feature; an interconnect structure in electrical contact with the metallization feature; and a second cap covering the interconnect structure and comprised of a material different than the fill material of the interconnect structure.

In an aspect of the disclosure, a method comprises: forming an interconnect structure; recessing the interconnect structure; depositing a conductive capping material in the recess in direct contact with metal material of the interconnect structure; and selectively depositing a film over the conductive capping material comprised of a same material as the metal material of the interconnect structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to interconnect structures and methods of manufacture. In embodiments, the structures and processes described herein prevent defects in metallization features of a device during fabrication processes. For examples, defects which can be prevented by the structures and methods described herein include corrosion of a fill material, such as pitting and dishing. In addition, the present disclosure can prevent out-diffusion, surface migration, electromigration and time-dependent dielectric breakdown (TDDB), amongst other examples.

In embodiments, the above issues are prevented by recessing the fill material and forming a capping material over the recessed fill material. In further embodiments, a film is placed over the capping material. In this way, the fill material is covered by at least one layer and is protected during the fabrication process. Therefore, it is now possible to avoid a direct polishing of the fill material, such as by a CMP process. Additionally, it is possible to control corrosion and other defects of the fill material, while still obtaining the benefit of a metallization feature having a specific fill material, e.g., cobalt (Co). Further advantages include the capping material chemically binding to the fill material to inhibit out-diffusion and surface migration of the fill material, and also the prevention of reactive ion etch (RIE) chemistry from negatively interacting with the fill material, which can also cause protrusions. In addition, the electromigration properties of the fill material are also improved.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
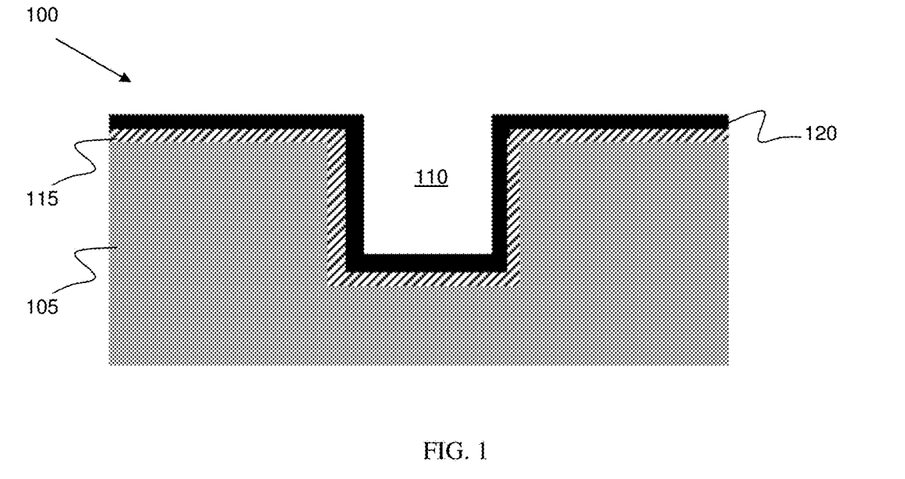
FIG. 1 shows an incoming structure, amongst other features, and respective fabrication processes in accordance with aspects of the present disclosure.

FIG. 1 shows an incoming structure and respective fabrication processes in accordance with aspects of the present disclosure. Specifically, the structure 100 includes a dielectric layer 105 comprised of an interlevel dielectric (ILD) material including, e.g., a low-k dielectric material. In embodiments, the dielectric layer 105 can be a dense oxide material, $SiO_2$ or SiN, amongst other materials. In further embodiments, the dielectric layer can be created from a precursor which forms the low-k dielectric material, such as octamethylcyclotetrasiloxane (OMCTS), for example.

The dielectric layer 105 is patterned by conventional lithography and etching, i.e., a RIE process, to form a trench 110. The patterning is followed by the deposition of a back end of line (BEOL) barrier material 115 over the dielectric layer 105 and within the trench 110. The barrier material 115 is deposited by conventional deposition processes, e.g., physical vapor deposition (PVD) or atomic layer deposition (ALD). A liner 120 is deposited on the barrier material 115 and over the dielectric layer 105 and formed within the trench 110. In this way, the trench 110 is a lined trench lined with the barrier material 115 and the liner 120. The liner 120 can be deposited by a conventional deposition process, i.e., a chemical vapor deposition (CVD) process.

In embodiments, the barrier material 115 can have a thickness in a range of about 5-15 nm, amongst other examples. In embodiments, the barrier material 115 can be composed of tantalum nitride (TaN), and more particularly, an ultra-thin TaN, i.e., less than 5 angstrom (Å), or an ultra-thin tantalum (Ta), or an ultra-thin titanium nitride (TiN), for example. In alternative embodiments, the barrier material 115 can be composed of copper manganese (CuMn) or manganese (Mn), amongst other examples. The liner 120 can be composed of cobalt (Co), amongst other examples.

Figure 2:
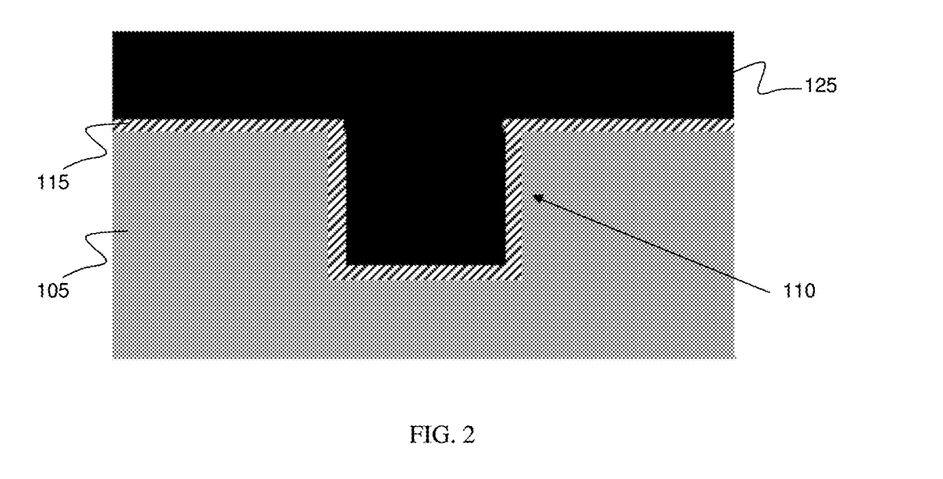
FIG. 2 shows a fill material, amongst other features, and respective fabrication processes in accordance with aspects of the present disclosure.

FIG. 2 shows a fill material 125 deposited over the dielectric layer 105 and within the trench 110. The fill material 125 can be deposited using conventional deposition processes, e.g., electroplating methods such as electrolytic plating or electroless plating, for example. In this way, the fill material 125 fills the trench 110 and overburdens the Co for a subsequent etching process. The fill material 125 can be any conductive material, e.g., Co, amongst other examples. In embodiments, the liner 120 and the fill material 125 can be the same material, i.e., Co.

Figure 3:
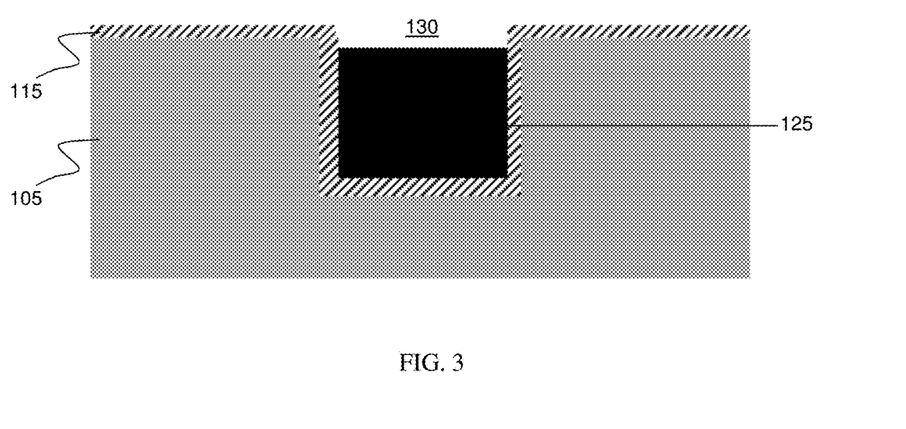
FIG. 3 shows a recessed fill material, amongst other features, and respective fabrication processes in accordance with aspects of the present disclosure.

FIG. 3 illustrates a selective etching process with respect to the Co, i.e., the fill material 125, to form recess 130. As shown in FIG. 3, the fill material 125 is recessed without a mask by a wet chemical etching process. Specifically, the wet etch process can use selective chemistries to remove the Co while leaving the TaN intact, i.e., the barrier material 115. More specifically, the wet etch will remove the liner 120 and the fill material 125 from the surfaces of the barrier material 115, including removing portions of the liner 120 and the fill material 125 within the trench 110. In this way, the recess 130 is formed within the trench 110, exposing the fill material 125 within the trench 110. In embodiments, the chemistries of the wet etch can comprise mineral acid plus hydrogen peroxide ($H_2O_2$). In alternative embodiments, the chemistries can comprise $SC_2$ and hydrochloric acid (HCl), for example. In embodiments, the recess 130 has a depth which is enough to allow another material to be deposited within the recess 130, although other dimensions are also contemplated herein.

Figure 4:
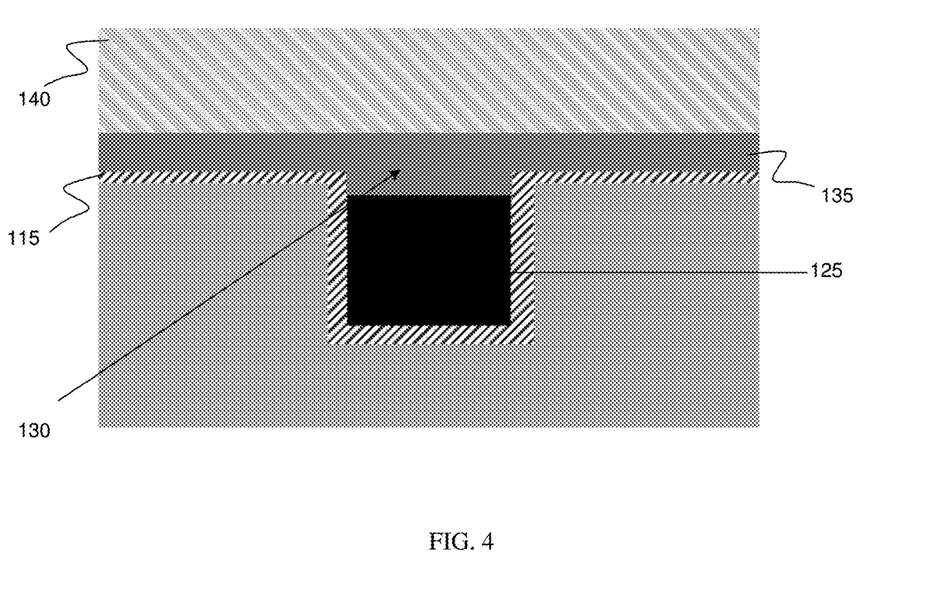
FIG. 4 shows a capping material, amongst other features, and respective fabrication processes in accordance with aspects of the present disclosure.

FIG. 4 shows the deposition of the capping material 135, which can be deposited by a conventional deposition process, i.e., a PVD process. Specifically, the capping material 135 is deposited over the barrier material 115 and within the recess 130, thereby covering the fill material 125 and filling the recess 130. In this way, the capping material 135, which serves as a first cap, is in a recesses of the fill material 125, and more particularly, is recessed within the Co of the fill material 125. In embodiments, the capping material 135 can be composed of Cu, CuMn, CuCo or copper aluminum (CuAl), amongst other examples. In specific embodiments, the total volume of Mn of the CuMn compound is in a range of about 0-2% of total volume, for example, and more preferably is about 0.5%. As shown in FIG. 4, a plating 140, such as a Cu plating by electrolytic plating or electroless plating processes, can be formed over the capping material 135. The plating 140 provides a Cu overburden over the capping material 135, for a subsequent polishing process.

Figure 5:
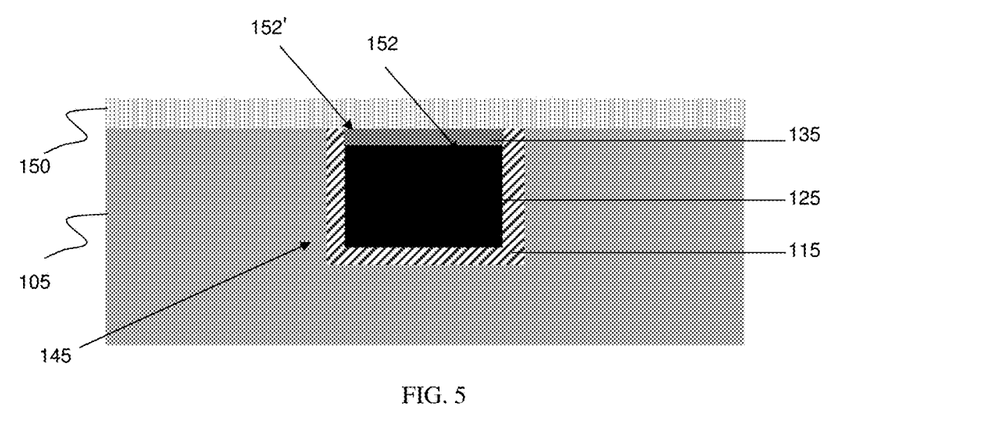
FIG. 5 shows a metallization feature, amongst other features, and respective fabrication processes in accordance with aspects of the present disclosure.

FIG. 5 shows portions of the capping material 135 and the barrier material 115 removed from surfaces of the dielectric layer 105, by a polishing process, such as by a CMP process. In this way, the metallization feature 145, comprised of the fill material 125 and the capping material 135, is formed in the trench 110 within the dielectric layer 105 to form an initial metal layer, M0. As shown in FIG. 5, the capping material 135 serves as a cap formed within a recessed portion of the metallization feature and covers the fill material 125 of the metallization feature 145, and is comprised of a material different than the fill material 125. A capping layer 150 is formed over the exposed portions of the dielectric layer 105 and the metallization feature 145 to cap the metallization feature 145. The capping layer 150 can be deposited by conventional deposition processes, e.g., CVD. The capping layer 150 can be any suitable material, e.g., an NBLOk material ($SiC_xN_yH_z$).

The capping material 135 formed over the Co of the fill material 125 provides various advantages. Specifically, the capping material 135 prevents a polishing of the Co, such as by a CMP process. In this way, pitting and dishing of the fill material 125 can be prevented. Additionally, the capping material 135 physically blocks the Co of the fill material 125 and also chemically binds to the Co, thereby inhibiting Co out-diffusion and surface migration due to thermal processes, such as annealing and deposition of the capping material 135 over the fill material 125. In this way, Co out-diffusion and surface migration are prevented, thereby preventing shorts in the final device. In addition, the capping material 135 prevents RIE chemistry from interacting with the fill material 125, which could also cause out-diffusion or protrusions. The capping material 135 also improves the electromigration properties of Co. Specifically, the capping material 135 prevents the Co atoms from migrating, thereby preventing the formation of voids and TDDB. The capping material 135 can provide all of these advantages while still allowing the use of Co as a fill material 125. Benefits of Co as a fill material 125 include better electrical properties, e.g., a lower resistance, in comparison to using other fill materials, such as Cu, when interconnect dimensions get below a critical value. A lower resistance is important as feature size decreases, for example.

In embodiments, the use of CuMn for the capping material 135 provides additional advantages. Specifically, the Mn diffuses through the TaN of the barrier material 115, forming a chemical bond between the Ta and Mn and the oxide present in the low-k oxide. This chemical bond provides a sufficient barrier to prevent any diffusion of Cu, and more particularly, Co. During an annealing process, the Mn will segregate to an oxide surface formed by a Cu oxide. Specifically, the Mn will segregate to an oxide surface at an interface 152 between the capping material 135 and the fill material 125, and will also segregate to an oxide surface at an interface 152' between the capping layer 150 and the capping material 135, thereby forming a manganese oxide ($Mn_xO_y$) at the interfaces 152, 152'. The Mn segregation helps to immobilize the Cu atoms.

Figure 6:
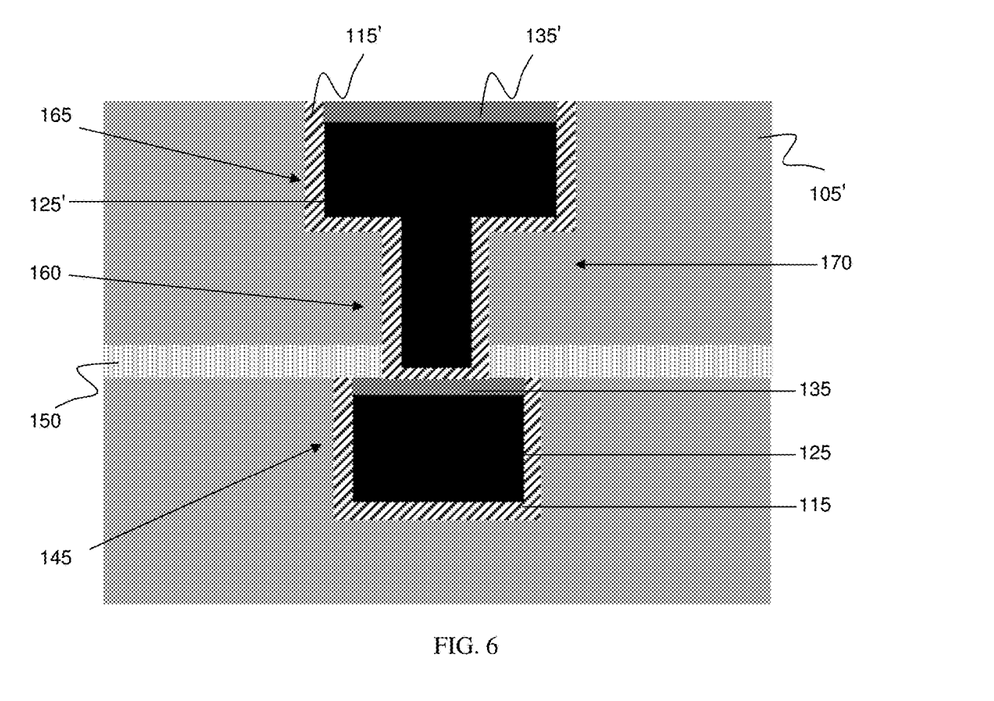
FIG. 6 shows an interconnect structure, amongst other features, and respective fabrication processes in accordance with aspects of the present disclosure.

FIG. 6 illustrates the formation of an interconnect structure 170 in accordance with aspects of the present disclosure and in electrical contact with the metallization feature 145.

Specifically, another metal layer is formed over the metal layer M0 by the processes and structures already described herein. In embodiments, for example, a dielectric layer 105' comprised of any suitable ILD material, such as a low-k dielectric material, is deposited over the capping layer 150 by a CVD process. A via 160 and a trench 165 over the via 160 are patterned within the dielectric layer 105' by conventional etching and lithography processes, e.g., a dual damascene process, to expose the capping layer 150. The capping layer 150 is etched by a RIE process so that the via 160 extends through and lands on the capping material 135. The patterning is followed by the deposition of a barrier material 115', along with a liner, such as liner 120. In embodiments, the barrier material 115' is deposited by PVD or ALD and lands directly on the capping material 135, while the liner material is deposited by a CVD process. In embodiments, the barrier material 115' can be composed of TaN, Mn or CuMn, while the liner material is comprised of Co, amongst other examples.

A fill material 125' composed of a conductive metal, e.g., Co, is deposited over the dielectric layer 105' and barrier material and within the via 160 and trench 165. The fill material 125' can be deposited using electroplating methods to ensure gap fill in the via 160 and trench 165, and to overburden the Co for a subsequent etching process. A wet etch process with selective chemistries removes the Co of the fill material 125' while leaving the TaN intact of the barrier material 115'. Specifically, the wet etch will remove the barrier material 115' and the fill material 125' from the surfaces of the barrier material 115', including removing portions of the barrier material and the fill material 125' within the trench 165, thereby forming a recess within the trench 165 having a depth which is enough to be filled with another material. In embodiments, the chemistries of the wet etch can comprise mineral acid plus hydrogen peroxide ($H_2O_2$), or SC2 and hydrochloric acid (HCl), amongst other examples. In this way, the interconnect structure 170 is recessed.

A capping material 135' comprised of Cu, CuMn, CuCo or CuAl is deposited by a PVD process, and serves as a second cap covering the fill material 125' of the interconnect structure 170 and filling the recess of the interconnect structure 170. In this way, the capping material 135' is in a recess of the fill material 125' of the interconnect structure 170, and the capping material 135' is in direct contact with the metal material, i.e., the fill material 125', of the interconnect structure 170. The capping material 135' is comprised of a material different than the fill material 125' of the interconnect structure 170. A Cu plating can be formed over the capping material 135' by electrolytic plating or electroless plating processes, for a Cu overburden over the capping material 135', for a subsequent polishing process. Remaining portions of the capping material 135' and the barrier material 115' are removed from surfaces of the dielectric layer 105' by a CMP process. In this way, a second metallization feature is formed, i.e., the interconnect structure 170, which is comprised of the fill material 125', the capping material 135' and the metallization feature 145.

The interconnect structure 170 formed within the dielectric layer 105' forms a first metal layer, M1. In embodiments, the capping material 135' can be composed of the same material as the capping material 135, or can be composed of different material. As an example, both the capping material 135' and the capping material 135 are composed of CuMn. As an alternative example, the capping material 135' can be composed of CuMn, while the capping material 135 is comprised of CuAl.

The capping material 135' provides the advantage of preventing a CMP polishing of the fill material 125', thereby preventing pitting and dishing. Additionally, the capping material 135' physically blocks the Co and chemically binds to the Co of the fill material 125', thereby inhibiting Co out-diffusion and surface migration due to thermal processes. Furthermore, the capping material 135' prevents RIE chemistry from interacting with the fill material 125', which could also cause out-diffusion or protrusions. In addition, the capping material 135' also improves the electromigration properties of Co by preventing the atoms of the Co from migrating, thereby preventing the formation of voids and TDDB. The capping material 135' provides all of these advantages while still allowing the use of Co as a fill material 125', resulting in a lower resistivity of the interconnect structure 170.

Figure 7:
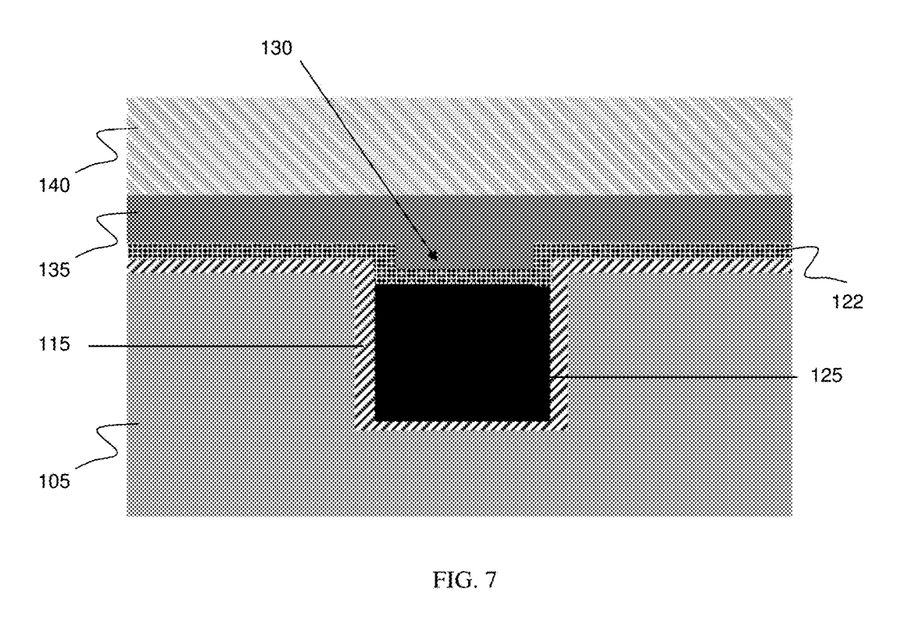
FIGS. 7-10 show alternative structures, amongst other features, and respective fabrication processes in accordance with aspects of the present disclosure.

FIGS. 7-10 show alternative structures, amongst other features, and respective fabrication processes in accordance with aspects of the present disclosure. Starting from FIG. 3, FIG. 7 begins alternative processes to form alternative structures in accordance with aspects of the present disclosure. Specifically, FIG. 7 shows a liner layer 122 deposited over the exposed portions of the barrier material 115 and within the recess 130, which can also cover the fill material 125. The liner layer 122 can be deposited by CVD processes, and can be composed of Co, for example. In this way, the liner layer 122 and the fill material 125 can be comprised of the same material, i.e., Co. A capping material 135 comprised of Cu, CuMn, CuCo or CuAl, is deposited by a PVD process, covering the liner layer 122 and filling any remaining portion of the recess 130. In this way, the liner layer 122 forms a liner on side of the conductive capping material, i.e., the capping material 135. A Cu plating can be formed over the capping material 135 by electrolytic plating or electroless plating processes, for a Cu overburden over the capping material 135, for a subsequent polishing process.

The capping material 135 provides the advantages of preventing a CMP polishing of the Co of the fill material 125, which prevents pitting and dishing. Additionally, the capping material 135 physically blocks the Co and chemically binds to the Co, thereby inhibiting Co out-diffusion and surface migration due to thermal processes. Furthermore, the capping material 135 prevents RIE chemistry from interacting with the fill material 125, which could also cause out-diffusion or protrusions. Additionally, the capping material 135 also improves the electromigration properties of Co by preventing the atoms of the Co from migrating, thereby preventing the formation of voids and TDDB. The capping material 135 provides all of these advantages while still allowing the use of Co as a fill material 125, resulting in a lower resistivity for metallization features of the device.

Figure 8:
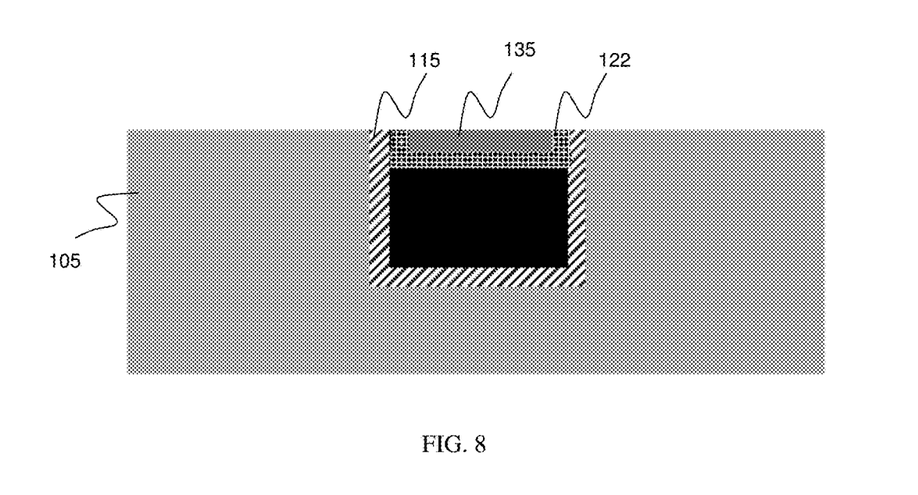

FIG. 8 shows portions of the capping material 135 and the barrier material 115 removed from surfaces of the dielectric layer 105 by a CMP process. In this way, the metallization feature 145', comprised of the fill material 125, the capping material 135 and the liner layer 122, is formed within the dielectric layer 105, thereby forming an initial metal layer M0. That is, the capping material 135 will remain within the recess of the fill material 125. In this way, the liner layer 122 is formed in a trench of the dielectric layer 105 and separates the capping material 135, which serves as a cap covering the fill material 125, from the fill material 125 of the metallization feature 145'.

Figure 9:
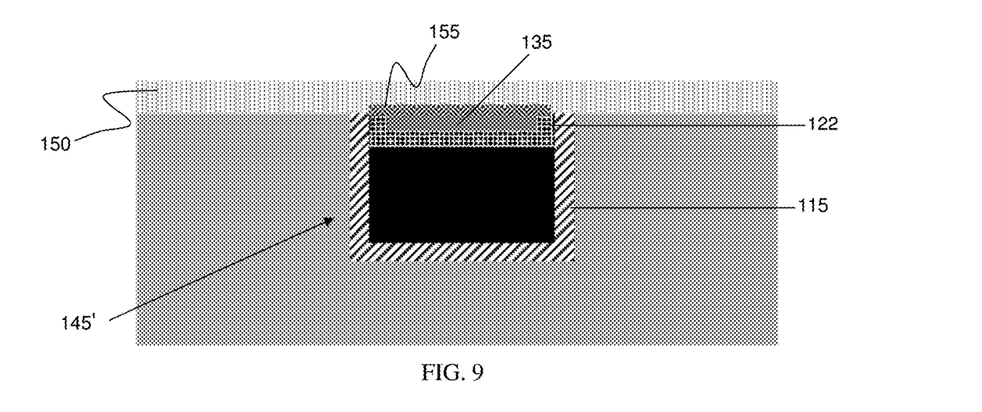

FIG. 9 shows a film 155 comprised of Co formed over the capping material 135 and the liner layer 122. The film 155 is selectively deposited directly on a metal, i.e., Cu, CuMn, CuCo or CuAl of the capping material 135 and the Co of the liner layer 122. In this way, the film 155 is directly over the capping material 135, which serves as a first cap, and the fill material 125 of the metallization feature 145'. Further, the conductive capping material 135 is locked in place by the film 155. The selective deposition of the film 155 can occur by a CVD process. In embodiments, the film 155 is relatively thin, and can have a thickness of about 1 nm, amongst other examples. A capping layer 150 comprised of NBLOk material is deposited by CVD over the exposed portions of the dielectric layer 105 and the film 155, thereby capping the metallization feature 145'.

The film 155 provides additional advantages to the capping material 135. Specifically, the film 155 binds relatively well to the capping material 135, and more particularly to Cu of the Cu, CuMn, CuCo or CuAl, of the capping material 135. Further, the Cu of the Cu, CuMn, CuCo or CuAl of the capping material 135 bonds to the film 155. This bond prevents escape of the Cu of the capping material 135, the Co of the liner layer 122 and the Co of the fill material 125, from occurring. In this way, the Co of the film 155 locks the Cu in place and further prevents defects such as out-diffusion, surface migration and electromigration of the materials of the metallization feature 145'. In addition, the Co of the liner layer 122 further assists the Co of the film 155 to lock the Cu in place. The film 155 provides all of these advantages while still allowing the use of Co as a fill material 125, resulting in a lower resistance of the metallization feature 145'.

Figure 10:
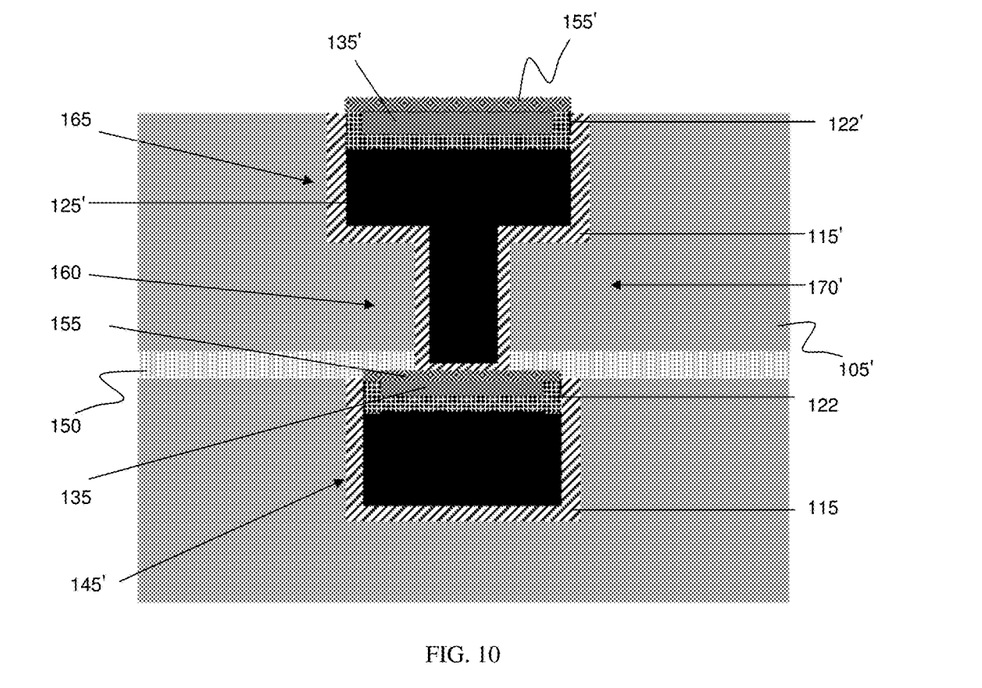

FIG. 10 illustrates the formation of an interconnect structure 170' which is in electrical contact with the metallization feature 145'. Specifically, another metal layer is formed over the metal layer M0 by the processes and structures already described herein in FIG. 6. Specifically, a via 160 and a trench 165 are patterned within the dielectric layer 105' by a dual damascene process. The capping layer 150 is then patterned by a RIE process so that the via 160 extends through and lands on the film 155. Since the film 155 is relatively thin, i.e., a thickness of about 1 nm, the RIE etching process will not cause protrusion issues. The patterning is followed by the deposition of a barrier material 115' and a barrier material, with the barrier material 115' comprised of TaN, Mn, Ta, TiN or CuMn and deposited by PVD or ALD or CVD and directly contacting the underlying film 155, while the liner material is comprised of Co and is deposited by a CVD process.

A fill material 125' composed of Co is deposited over the dielectric layer 105' and liner material and within the via 160 and trench 165. The fill material 125' can be deposited using electroplating methods such as electrolytic plating or electroless plating to fill the gaps in the via 160 and trench 165 and to overburden the Co for a subsequent etching process. A wet etch process with selective chemistries removes the Co of the fill material 125' while leaving the TaN intact of the barrier material 115'. Specifically, the wet etch will remove the liner material and the fill material 125' from the surfaces of the barrier material 115', including removing portions of the liner material and the fill material 125' within the trench 165, thereby forming a recess within the trench 165 with a depth which is enough to be filled with another material. In embodiments, the chemistries of the wet etch can comprise mineral acid plus hydrogen peroxide ($H_2O_2$), or SC2 and hydrochloric acid (HCl), amongst other examples.

A liner layer 122' is deposited over the exposed portions of the barrier material 115' and within the trench 165, and can cover the fill material 125'. The liner layer 122' can be deposited by a conventional deposition process, i.e., CVD, and can be composed of Co, for example. In this way, the liner layer 122' and the fill material 125' can be comprised of the same material, i.e., Co. A capping material 135', which serves as a second cap covering the interconnect structure 170', is deposited by a PVD process, covering the liner layer 122' and over the fill material 125', thereby filling any remaining portion of the trench 165. In this way, the liner layer 122' is formed in a trench of the dielectric layer 105' and separates the capping material 135', which serves as a cap covering the fill material 125', from the fill material 125' of the interconnect structure 170'. In embodiments, the capping material 135' can be Cu, CuMn, CuCo or CuAl. In further embodiments, the capping material 135' can be comprised of the same material as the capping material 135, or can be comprised of different material. As an example, both the capping material 135' and the capping material 135 are CuMn. As an alternative example, the capping material 135' can be CuMn while the capping material 135 is CuAl. A Cu plating can be formed over the capping material 135' by electrolytic plating or electroless plating processes, for a Cu overburden over the capping material 135', for a subsequent polishing process.

Remaining portions of the capping material 135' and the barrier material 115' are removed from surfaces of the dielectric layer 105' by a CMP process. The capping material 135' prevents a CMP polishing of the Co of the fill material 125', while also physically blocking the Co and chemically binding to the Co, thereby inhibiting Co out-diffusion and surface migration due to thermal processes. Furthermore, the capping material 135' prevents RIE chemistry from interacting with the fill material 125', which would also cause out-diffusion or protrusions. Additionally, the capping material 135' improves the electromigration properties of Co by preventing the atoms of the Co from migrating, thereby preventing the formation of voids and TDDB. The capping material 135' provides all of these advantages while still allowing the use of Co as a fill material 125', resulting in a lower resistivity for the metallization features of the device.

A film 155' of Co is selectively deposited by a CVD process over the capping material 135' and the liner layer 122'. In this way, a second metallization feature is formed, i.e., the interconnect structure 170', which is comprised of the fill material 125', the capping material 135', the liner layer 122, and the film 155'. The interconnect structure 170' formed within the dielectric layer 105' forms a first metal layer M1.

The film 155' binds relatively well to the capping material 135', and more particularly to Cu of the Cu, CuMn, CuCo or CuAl, of the capping material 135'. Further, the Cu of the Cu, CuMn, CuCo or CuAl of the capping material 135' bonds to the film 155'. This bond prevents escape of the Cu of the capping material 135', the Co of the liner layer 122 and the Co of the fill material 125', from occurring. In this way, the film 155' locks the Cu in place and further prevents defects such as out-diffusion, surface migration and electromigration of the materials of the interconnect structure 170'. Additionally, the Co of the liner layer 122' further assists the Co of the film 155' in locking the Cu in place. The film 155' provides all of these advantages while still allowing the use of Co as a fill material 125', resulting in a lower resistivity of the interconnect structure 170'.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a metallization feature comprising a barrier material, a fill material on the barrier material, a liner on the fill material and an upper portion of the barrier material, and a film directly on portions of the liner, all formed within a dielectric layer;
   at least one cap above the fill material of the metallization feature and directly on a surface of the liner, the at least one cap being encapsulated by the liner and the film, and the at least one cap further comprised of a material different than the fill material of the metallization feature;
   a capping layer directly on a surface of the film and on a portion of the barrier material; and
   an interconnect structure extending within an opening of the capping layer and in direct contact with the film such that electrical contact is provided with the metallization feature.

2. The structure of claim 1, further comprising at least one cap covering a fill material of the interconnect structure and comprised of a material different than a fill material of the interconnect structure.

3. The structure of claim 2, wherein the at least one cap is within a recessed portion of the metallization feature.

4. The structure of claim 2, further comprising the liner formed in a trench of the dielectric layer and which separates the at least one cap covering the fill material of the metallization feature, wherein the liner is comprised of a same material as the fill material of the metallization feature and the material of the interconnect structure.

5. The structure of claim 4, wherein the fill material of the interconnect structure is Co and the at least one cap covering the fill material of the interconnect structure is recessed within the Co.

6. The structure of claim 1, wherein the at least one cap covering the fill material of the metallization feature and the at least one cap covering the material of the interconnect structure are Cu material.

7. The structure of claim 6, wherein the Cu material is selected from the group consisting of Cu, CuMn, CuCo or CuAl.

8. The structure of claim 7, wherein the barrier material is a back end of line (BEOL) barrier material.

9. The structure of claim 8, wherein the BEOL barrier material has a thickness in a range of about 5-15 nm.

10. The structure of claim 9, wherein the BEOL barrier material is selected from the group consisting of tantalum nitride (TaN), ultra-thin TaN, ultra-thin tantalum (Ta), and ultra-thin titanium nitride (TiN).

11. A structure, comprising:
    a metallization feature formed within a trench of a dielectric layer and comprising a barrier material lining a sidewall of the trench and a metal fill material directly on the barrier material and partially filling the trench;
    a first cap covering the fill material within the trench;
    a film directly on the first cap and over the metal fill material of the metallization feature;
    a liner layer directly contacting both the metal fill material and an upper portion of the barrier material and lining sides of the first cap, the liner layer further separating the first cap from the metal fill material and encapsulating the first cap with the film;
    a capping layer directly on a surface of the film and an upper portion of the barrier material;
    an interconnect structure in direct electrical extending through an opening in the capping layer and directly contacting the film; and
    a second cap covering the interconnect structure and comprised of a material different than the fill material of the metallization feature.

12. The structure of claim 11, wherein the liner layer includes a Co liner.

13. The structure of claim 12, wherein the film is made of Co.

14. The structure of claim 13, wherein the fill material of the metallization feature and the interconnect structure are Co.

15. The structure of claim 11, wherein the first cap and the second cap are the same material.

16. The structure of claim 11, wherein the first cap and the second cap are different materials.

17. The structure of claim 16, wherein the different materials are selected from the group consisting of Cu, CuMn, CuCo or CuAl.

18. The structure of claim 17, wherein Mn of the CuMn has a total weight in a range of 0-2% of the CuMn.

19. The structure of claim 11, wherein the first cap is in a recess of the fill material.

20. The structure of claim 11, wherein the second cap is in a recess of the fill material of the interconnect structure.

* * * * *